(12) United States Patent
Iihola et al.

(10) Patent No.: US 9,232,658 B2
(45) Date of Patent: Jan. 5, 2016

(54) METHOD FOR MANUFACTURING AN ELECTRONIC MODULE

(75) Inventors: Antti Iihola, Helsinki (FI); Timo Jokela, Halikko (FI)

(73) Assignee: GE Embedded Electronics Oy, Helsinki (FI)

( * ) Notice: Subject to any disclaimer, the term of this patent is extended or adjusted under 35 U.S.C. 154(b) by 103 days.

(21) Appl. No.: 12/753,329

(22) Filed: Apr. 2, 2010

(65) Prior Publication Data

US 2010/0188823 A1    Jul. 29, 2010

Related U.S. Application Data

(62) Division of application No. 10/572,340, filed as application No. PCT/FI2004/000538 on Sep. 15, 2004.

(30) Foreign Application Priority Data

Sep. 18, 2003  (FI) ..................................... 20031341

(51) Int. Cl.
*H01L 23/02*    (2006.01)
*H05K 1/18*    (2006.01)
(Continued)

(52) U.S. Cl.
CPC ............ *H05K 1/188* (2013.01); *H01L 23/5389* (2013.01); *H01L 24/19* (2013.01); *H01L 24/24* (2013.01); *H01L 24/82* (2013.01); *H01L 25/0655* (2013.01); *H01L 25/50* (2013.01); *H01L 2224/24227* (2013.01); *H01L 2224/82039* (2013.01); *H01L 2224/92144* (2013.01); *H01L 2924/01005* (2013.01); *H01L 2924/01006* (2013.01); *H01L 2924/01015* (2013.01); *H01L 2924/01019* (2013.01); *H01L 2924/01029* (2013.01); *H01L 2924/01033* (2013.01); *H01L 2924/01057* (2013.01); *H01L 2924/01079* (2013.01); *H01L 2924/01082* (2013.01);
(Continued)

(58) Field of Classification Search
CPC ..... H01L 23/5389; H01L 24/24; H01L 24/82; H01L 25/0655; H01L 25/50; H01L 2224/24227
USPC .................................. 257/686, 723–725, 777
See application file for complete search history.

(56) References Cited

U.S. PATENT DOCUMENTS 4,237,607 A * 12/1980 Ohno .............................. 29/840
4,246,595 A    1/1981 Noyori et al.
(Continued)

FOREIGN PATENT DOCUMENTS

EP    0774 888 A2    11/1996
EP    1 156 525 A1    11/2001
(Continued)

*Primary Examiner* — Ori Nadav
(74) *Attorney, Agent, or Firm* — Seppo Laine Oy

(57) ABSTRACT

This publication discloses a method for manufacturing an electronic module, in which manufacture commences from an insulating-material sheet (1). At least one recess (2) is made in the sheet (1) and extends through the insulating-material layer (1) as far as the conductive layer on the opposite surface (1*a*). A component (6) is set in the recess, with its contact surface towards the conductive layer and the component (6) is attached to the conductive layer. After this, a conductive pattern (14) is formed from the conductive pattern closing the recess, which is electrically connected from at least some of the contact areas or contact protrusions of the component (6) set in the recess.

14 Claims, 11 Drawing Sheets

(51) Int. Cl.
*H01L 23/538* (2006.01)
*H01L 23/00* (2006.01)
*H01L 25/065* (2006.01)
*H01L 25/00* (2006.01)
*H05K 3/46* (2006.01)

(52) U.S. Cl.
CPC ..... *H01L2924/07802* (2013.01); *H05K 3/4602* (2013.01); *H05K 3/4611* (2013.01); *H05K 3/4652* (2013.01); *H05K 2201/0355* (2013.01); *H05K 2201/0394* (2013.01); *Y10T 29/4913* (2015.01); *Y10T 29/49126* (2015.01); *Y10T 29/49144* (2015.01); *Y10T 29/49156* (2015.01)

(56) References Cited

U.S. PATENT DOCUMENTS

| | | | |
|---|---|---|---|
| 4,993,148 A | 2/1991 | Adachi et al. | |
| 5,042,145 A | 8/1991 | Boucquet | |
| 5,048,179 A | 9/1991 | Shindo et al. | |
| 5,081,562 A | 1/1992 | Adachi et al. | |
| 5,227,583 A * | 7/1993 | Jones | 174/541 |
| 5,248,852 A | 9/1993 | Kumagai | |
| 5,306,670 A | 4/1994 | Mowatt et al. | |
| 5,353,195 A | 10/1994 | Fillion et al. | |
| 5,355,102 A | 10/1994 | Kornrumpf et al. | |
| 5,497,033 A | 3/1996 | Fillion et al. | |
| 5,654,220 A | 8/1997 | Leedy | |
| 5,840,593 A | 11/1998 | Leedy | |
| 5,985,693 A | 11/1999 | Leedy | |
| 5,994,166 A * | 11/1999 | Akram et al. | 438/108 |
| 6,154,366 A | 11/2000 | Ma et al. | |
| 6,271,469 B1 | 8/2001 | Ma et al. | |
| 6,284,564 B1 | 9/2001 | Balch et al. | |
| 6,475,877 B1 | 11/2002 | Saia et al. | |
| 6,701,614 B2 | 3/2004 | Ding et al. | |
| 6,713,859 B1 | 3/2004 | Ma | |
| 6,806,428 B1 | 10/2004 | Kimura et al. | |
| 6,876,072 B1 | 4/2005 | Wang et al. | |
| 2002/0053465 A1 | 5/2002 | Kawakita et al. | |
| 2003/0067074 A1 | 4/2003 | Kinsman | |
| 2003/0068852 A1 | 4/2003 | Towle et al. | |
| 2003/0068877 A1 | 4/2003 | Kinsman | |
| 2003/0090883 A1 * | 5/2003 | Asahi et al. | 361/761 |
| 2003/0159852 A1 | 8/2003 | Nakamura | |
| 2004/0000710 A1 | 1/2004 | Oya | |

FOREIGN PATENT DOCUMENTS

| | | |
|---|---|---|
| JP | 2003204167 | 7/2003 |
| JP | 2003229513 | 8/2003 |
| WO | WO 03/065778 A1 | 8/2003 |
| WO | WO 2004/089048 A1 | 10/2004 |

* cited by examiner

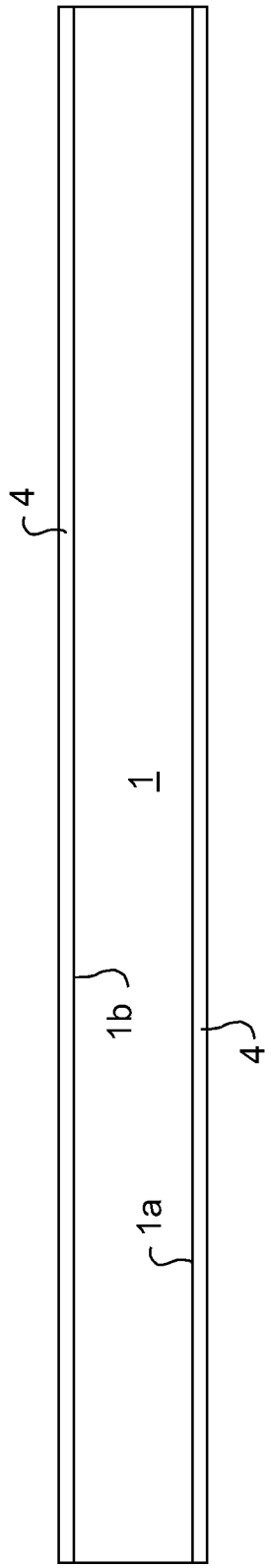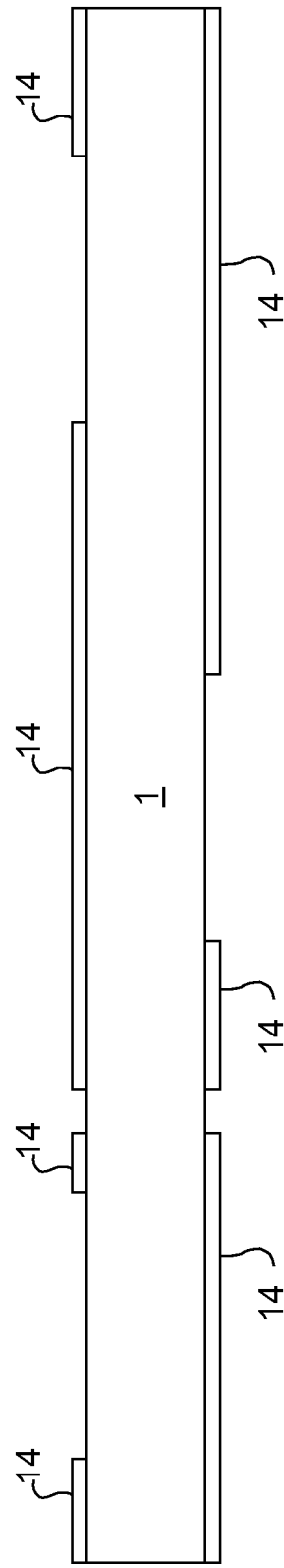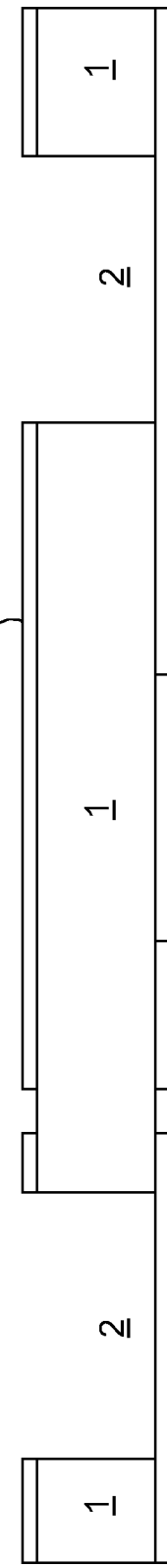

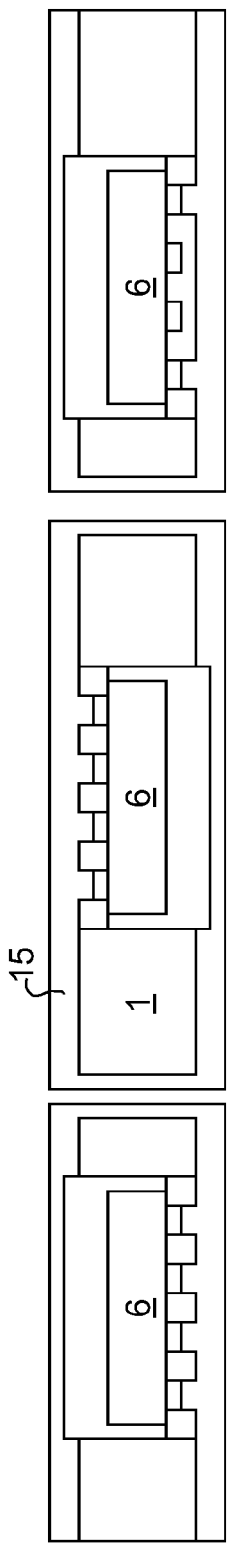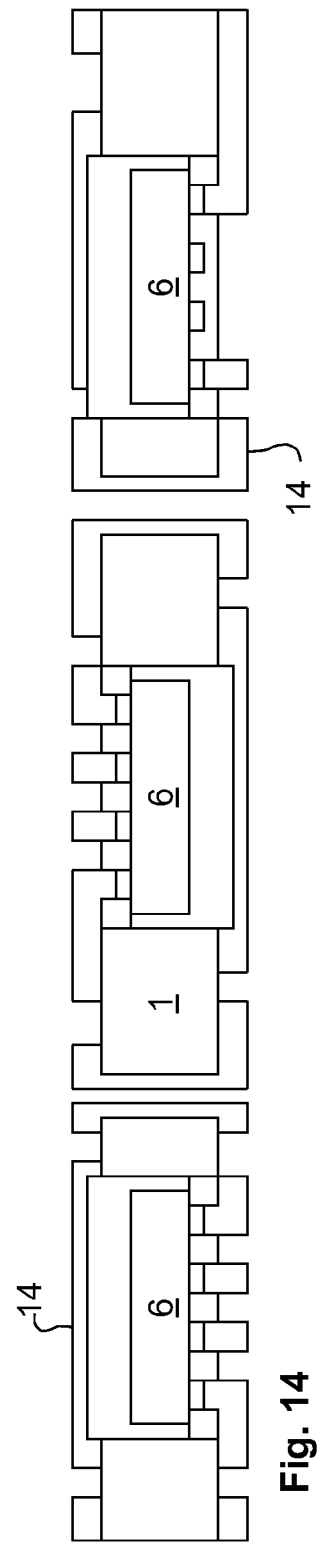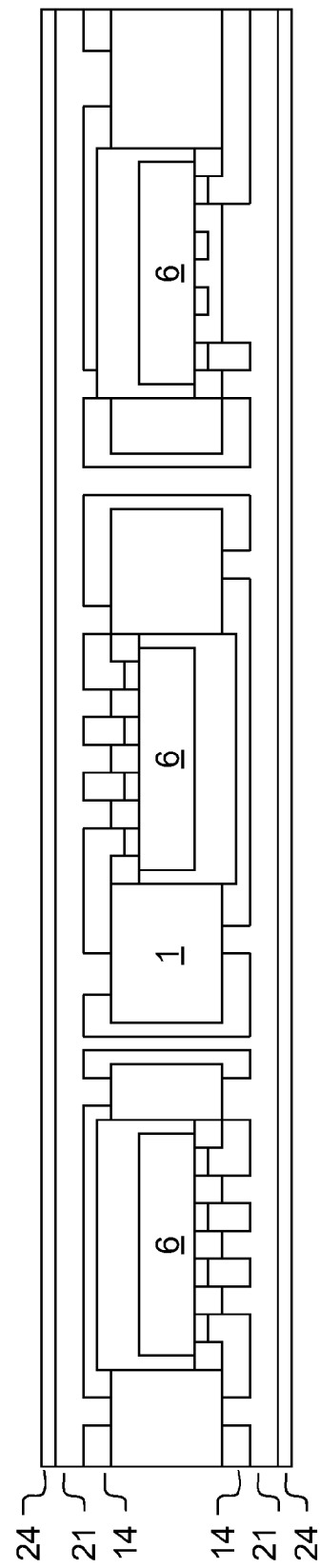

METHOD FOR MANUFACTURING AN ELECTRONIC MODULE

RELATED APPLICATIONS

The present application is a divisional application of U.S. patent application Ser. No. 10/572,340 filed Nov. 14, 2006, titled "METHOD FOR MANUFACTURING AN ELECTRONIC MODULE," which claims the benefit of priority from International Patent Application No. PCT/FI04/00538 filed Sep. 15, 2004 and Finnish Patent Application No. 20031341 filed Sep. 18, 2003, the entire disclosure of each application being expressly incorporated by reference herein.

The present invention relates to a method for manufacturing an electronic module.

In particular, the invention relates to an electronic module, in which one or more components are embedded in an installation base. The electronic module being manufactured can be a module like a circuit board, which includes several components, which are connected to each other electrically, through conducting structures manufactured in the module. The invention relates particularly to an electronic module, which contains microcircuits, to which several contact terminals are connected. In addition to, or in place of microcircuits, other components too, for example, passive components, can, of course, be embedded in the installation base. Thus, the intention is to embed in the electronic module such components as are typically attached in an unpackaged form to the circuit board (to the surface of the circuit board). Another important group of components are components that are typically packaged for connection to a circuit board. The electronic modules to which the invention relates can, of course, also include other types of components.

The installation base can be of a type similar to the bases that are generally used in the electronics industry as installation bases for electrical components. The task of the base is to provide components with a mechanical attachment base and the necessary electrical connections to both components that are on the base and those that are outside the base. The installation base can be a circuit board, in which case the construction and method to which the invention relates are closely related to the manufacturing technology of circuit boards. The installation base may also be some other base, for example, a base used in the packaging of a component or components, or a base for an entire functional module.

The manufacturing techniques used for circuit boards differ from those used for microcircuits in, among other things, the fact that the installation base in microcircuit manufacturing techniques, i.e. the substrate, is of a semiconductor material, whereas the base material of an installation base for circuit boards is some form of insulating material. The manufacturing techniques for microcircuits are also typically considerably more expensive that the manufacturing techniques for circuit boards.

The constructions and manufacturing techniques for the cases and packages of components, and particularly semiconductor components differ from the construction and manufacture of circuit boards, in that component packaging is primarily intended to form a casing around the component, which will protect the component mechanically and facilitate the handling of the component. On the surface of the component, there are connector parts, typically protrusions, which allow the packaged component to be easily set in the correct position on the circuit board and the desired connections to be made to it. In addition, inside the component case, there are conductors, which connect the connector parts outside the case to connection zones on the surface of the actual component, and through which the component can be connected as desired to its surroundings.

However, component cases manufactured using conventional technology demand a considerable amount of space. As electronic devices have grown smaller, there has been a trend to eliminate component cases, which take up space, are not essential, and create unnecessary costs. Various constructions and methods have been developed to solve this problem, with the aid of which components can placed inside the circuit-board structure.

U.S. Pat. No. 4,246,595 discloses one solution, in which recesses are formed in the installation base for the components. The bottoms of the recesses are bordered by a two-layered insulation layer, in which holes are made for the connections of the component. The layer of the insulation layer that lies against the components is made of an adhesive. After this, the components are embedded in the recesses with their connection zones facing the bottom of the recess, electrical contacts being formed to the components through the holes in the insulation layer. If it is wished to make the structure mechanically durable, the component must also be attached to an installation base, so that the method is quite complicated. It is extremely difficult to use a complicated method, which demands several different materials and process stages, to profitably manufacture cheap products.

JP application publication 2001-53 447 discloses a second solution, in which a recess is made for the component in an installation base. The component is placed in the recess, with the component's contact areas facing towards the surface of the installation base. Next, an insulation layer is made on the surface of the installation base and over the component. Contact openings for the component are made in the insulation layer and electrical contacts are made to the component, through the contact openings. In this method, considerable accuracy is demanded in manufacturing the recess and setting the component in the recess, so that the component will be correctly positioned, to ensure the success of the feedthroughs, relative to the width and thickness of the installation board.

International patent application publication WO 03/065778 discloses a method, in which at least one conductive pattern is made in the base, as are through-holes for semiconductor components. After this, the semiconductor components are placed in the holes, aligned relatively to the conductive pattern. The semiconductor components are attached to the structure of the base and one or more conductive-pattern layers are manufactured in the base, in such a way that at least one conductive pattern forms an electrical contact with the contact areas on the surface of the semiconductor component.

International patent application publication WO 03/065779 discloses a method, in which through-holes are made in the base for semiconductor components, in such a way that the holes extend between the first and second surfaces of the base. After the manufacture of the holes, a polymer film is spread over the second surface of the base structure, in such a way that the polymer film also covers the through-holes made for the semiconductor components, on the second side of the base structure. Before the hardening of the polymer film, or after its partial hardening, the semiconductor components are placed in the holes made in the base, from the direction of the first surface of the base. The semiconductor components are pressed against the polymer film so that they adhere to the polymer film. After this, the final hardening of the polymer film is performed and additional conductive-pattern layers are manufactured, in such a way that at least one conductive pattern forms an electrical contact with the contact areas on the surface of the semiconductor components.

The invention is intended to create a simple and reliable method with low manufacturing costs, for embedding components in an installation base.

The invention is based on commencing manufacture from an insulating board, which is surfaced on at least one side with a conductive layer. After this, a recess is made in the insulation, which opens onto one surface of the board, but does not penetrate the conductive layer on the opposite surface of the board. A component is attached to the recess and electrical contacts are formed between the conductive layer and the contact areas, or contact protrusions of the component. After the attachment of the component, conductive patterns are formed from this conductive layer, which become part of the circuit-board structure, or other electronic module.

More specifically, the method according to the invention is characterized by what is stated in claim 1.

Considerable advantages are gained with the aid of the invention. This because the invention can be used to design a simple and reliable method with low manufacturing costs, which can be used to manufacture electronic modules containing embedded components. The conductively surfaced insulating board used as the basic material is one of the basic raw materials of the circuit-board industry and boards of this kind are available cheaply and reliably. In the method, the use of the raw material is extremely efficient, as the conductively surfaced insulating board is exploited to manufacture the conductive patterns of the electronic module. Even circuits that are embedded inside the insulating board can be connected electrically to this conductive-pattern layer.

The invention has embodiments, according to which relatively few process stages are required in the manufacturing process. Embodiments with fewer processing stages correspondingly also need less process equipment and various manufacturing methods. With the aid of such embodiments, in many cases it is also possible to reduce the manufacturing costs, compared to more complicated processes.

The number of the conductive-pattern layers of the electronic module can also be selected according to the embodiment. There can be, for example, one or two conductive-pattern layers. In addition, additional conductive-pattern layers can also be manufactured on top of them, in the manner known in the circuit-board industry. There can thus be a total of, for example, three, four, or five conductive-pattern layers in a module. In the very simplest embodiments, there is only a single conductive-pattern layer, and, indeed, any conductive layer. In some embodiments, each of the conductive layers contained in an electronic module can be utilized to form conductive patterns.

There are also embodiments of the invention, in which conductive patterns can be manufactured at the locations of the components. This will increase the wiring capability of the structure, which, in turn, will permit the components to be placed closer together. The wiring capability can also be improved by placing some of the components 'upside-down', so that the active surfaces of components will face both surfaces of the board. In the following, the invention is examined with the aid of examples and with reference to the accompanying drawings.

FIGS. 1-17 show a series of cross-sections of the manufacturing methods in one embodiment of the invention.

Figure 4:
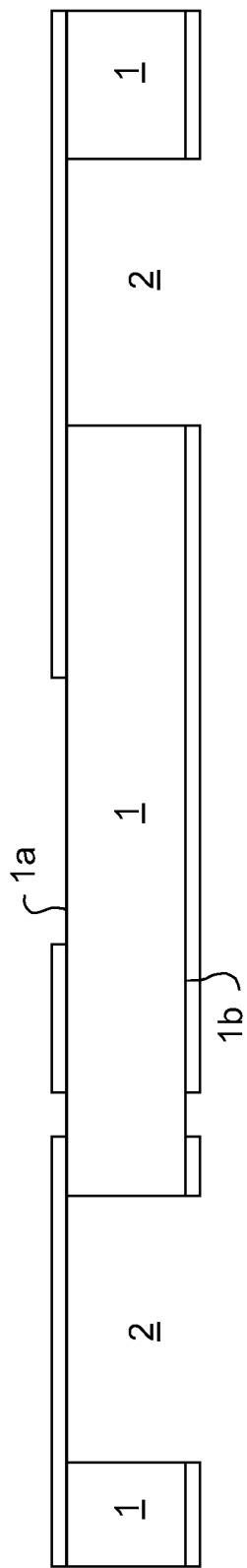
Figure 5:
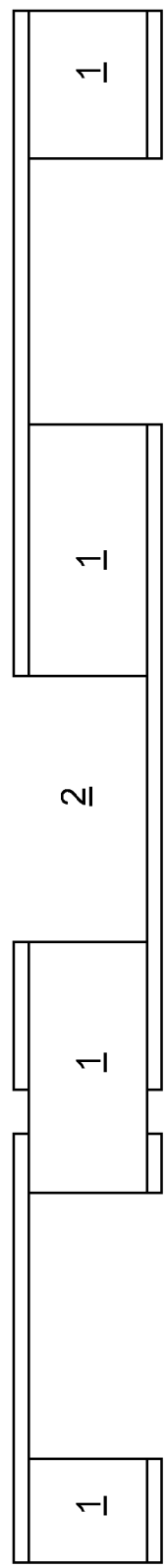
Figure 6:
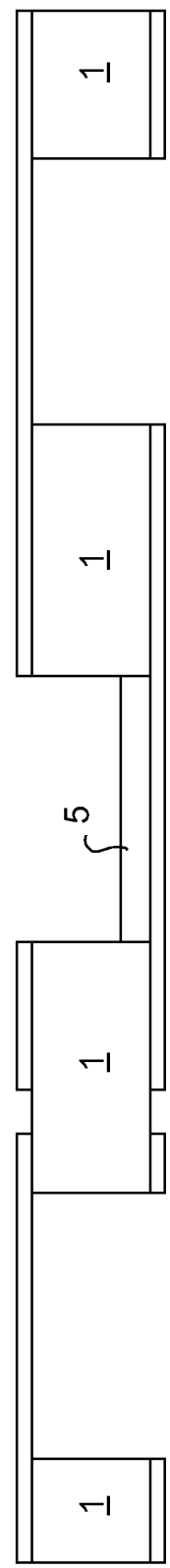
Figure 7:
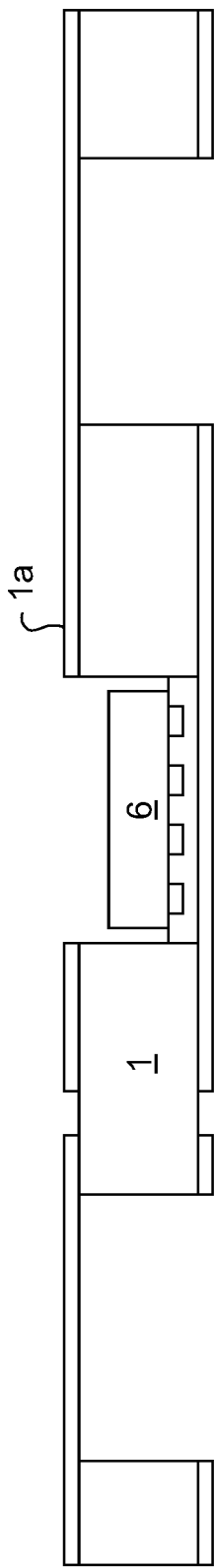
Figure 8:
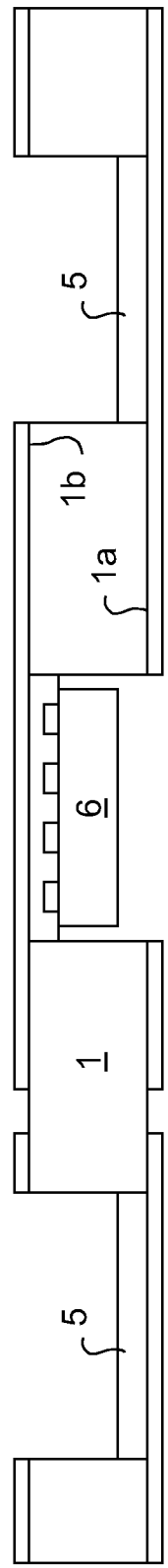
Figure 9:
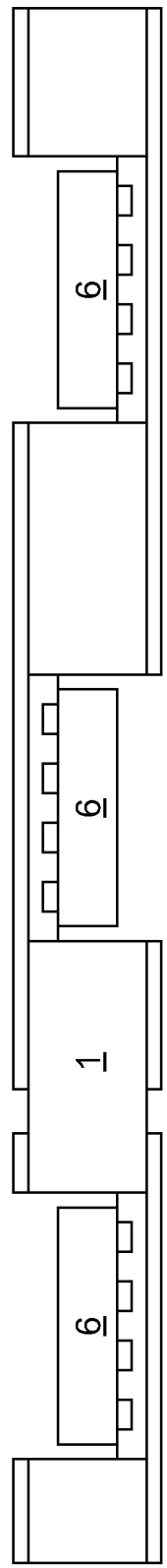
Figure 10:
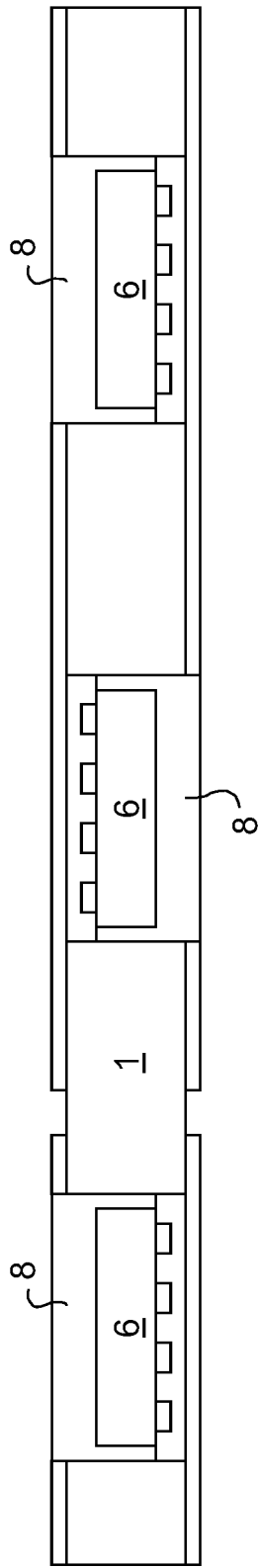
Figure 11:
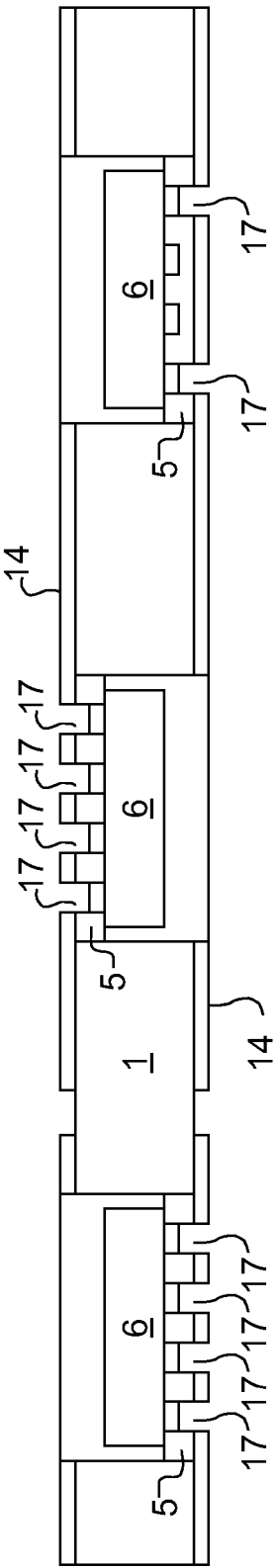
Figure 12:
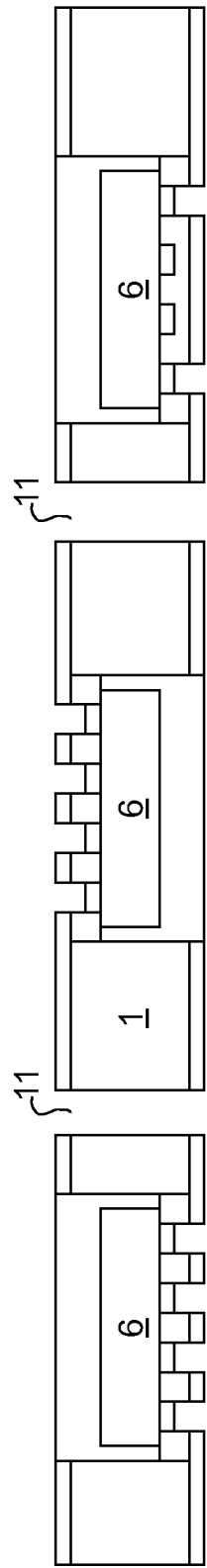
Figure 16:
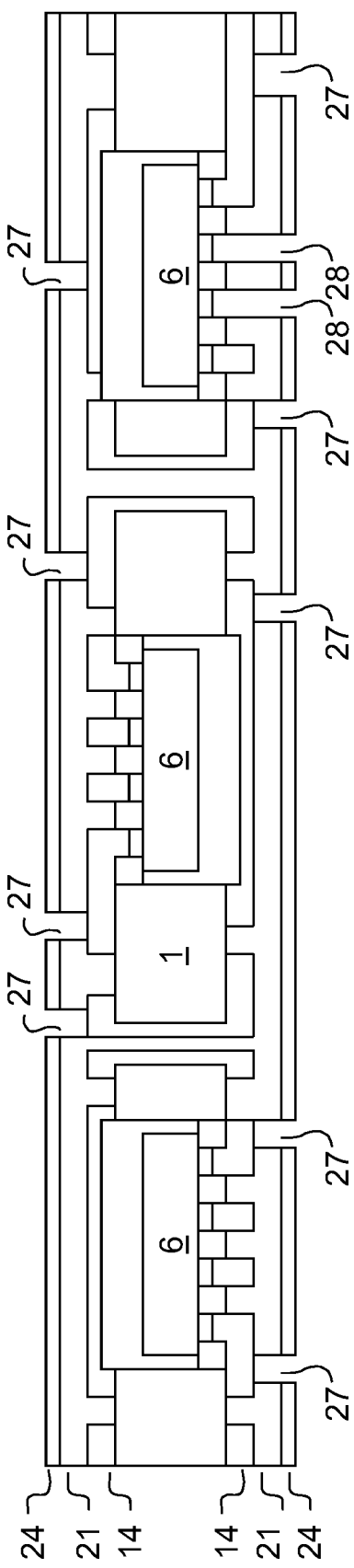
Figure 17:
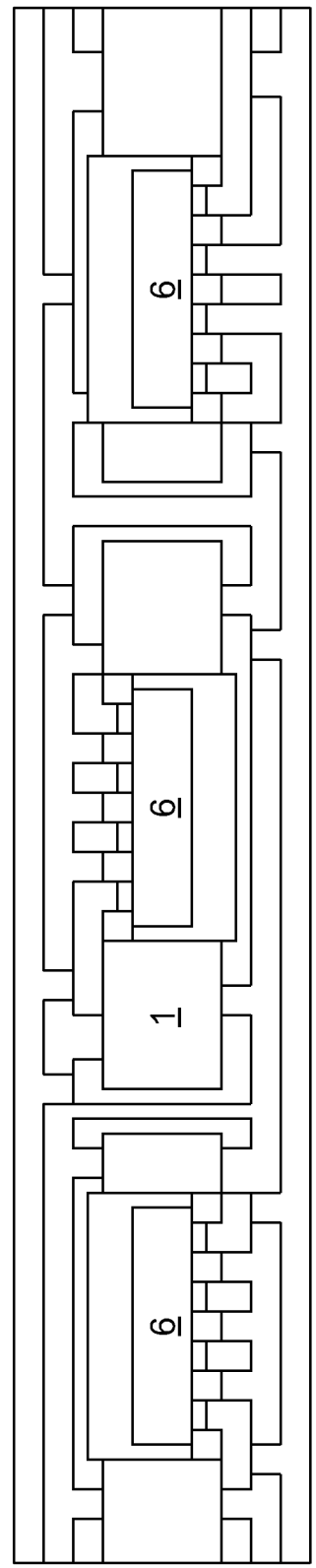
Figure 18:
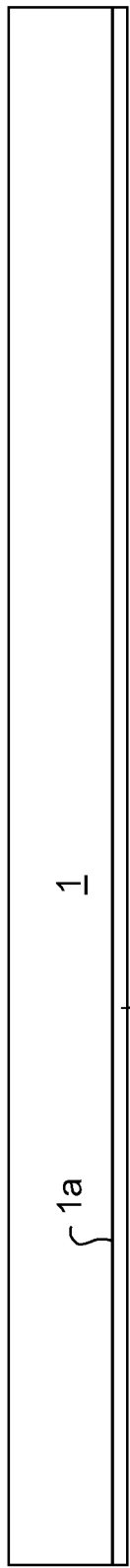
FIGS. 18-27 show a series of cross-sections of manufacturing methods according to second embodiments.
Figure 19:
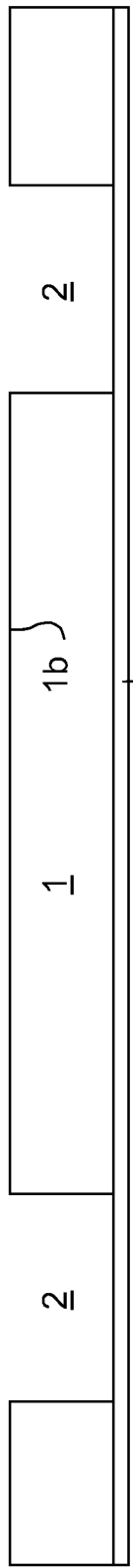
Figure 20:
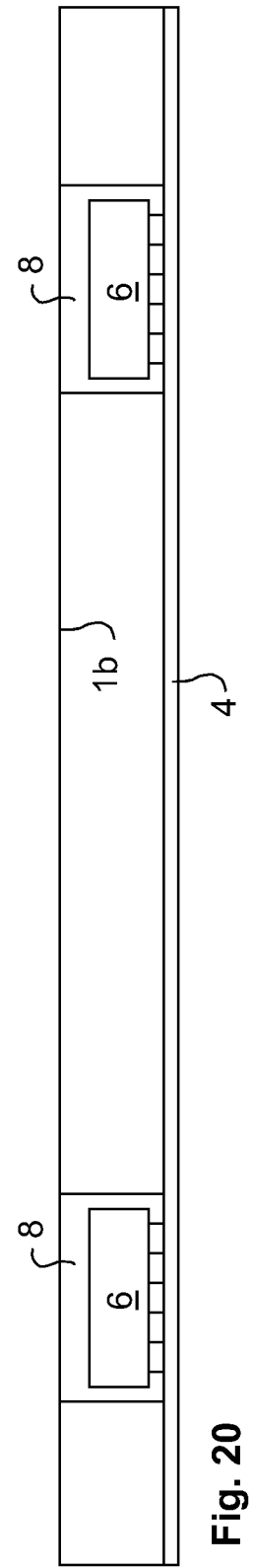
Figure 21:
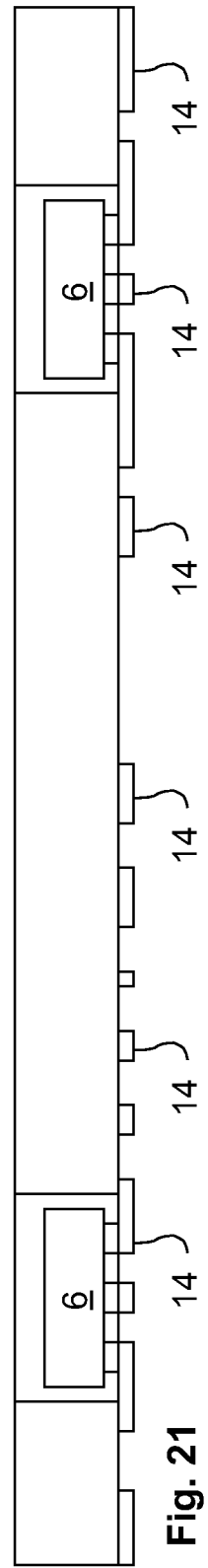
Figure 22:
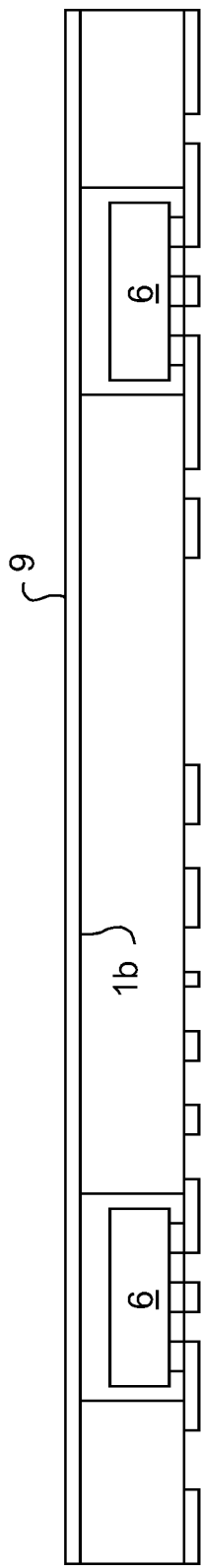
Figure 23:
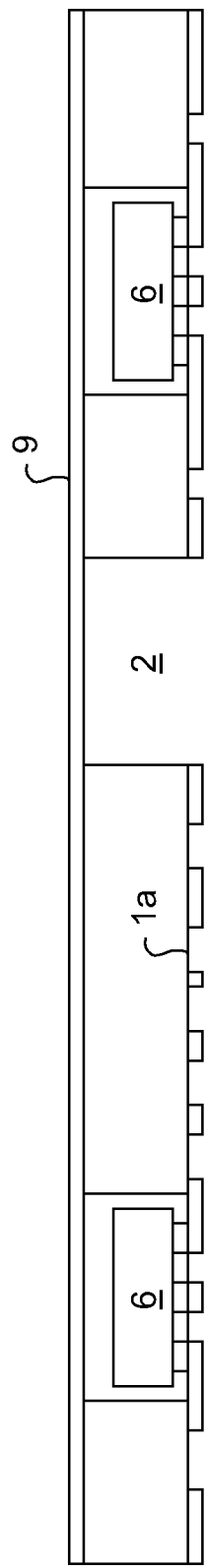
Figure 24:
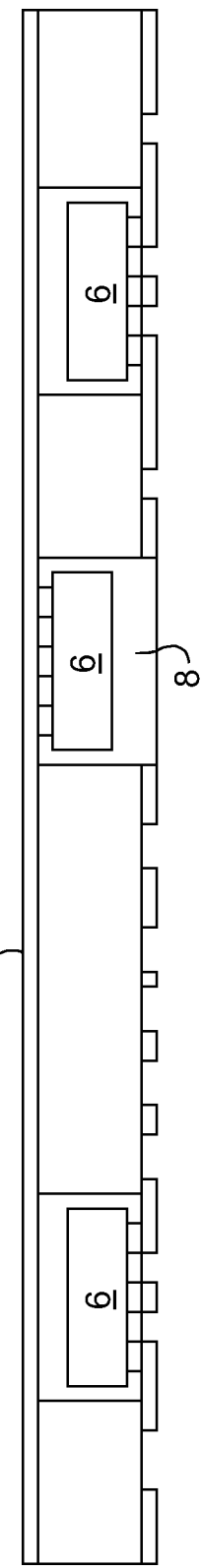
Figure 25:
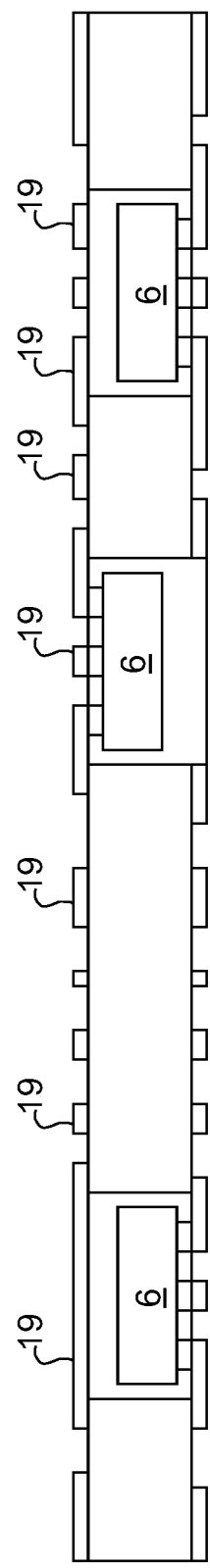
Figure 26:
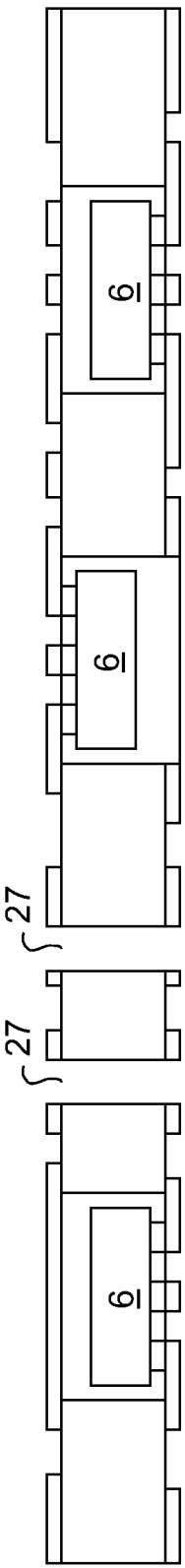
Figure 27:
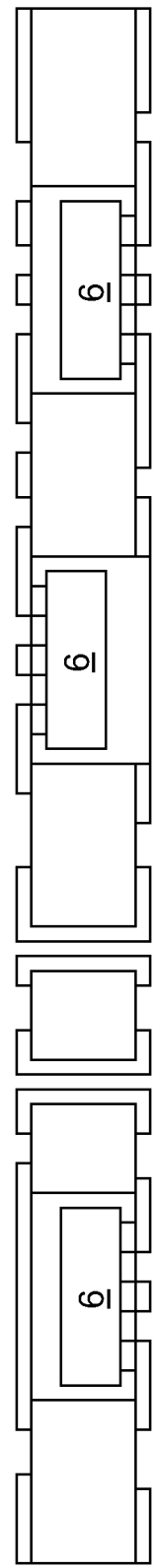

In the methods of the examples, manufacturing is started by manufacturing an installation base of insulating material, which has a conductive layer on at least one surface. Typically, a commercially available sheet 1 of insulating material, both surfaces 1a, 1b of which are surfaced with a conductive layer 4, is selected as the installation base. The insulating material 1 can be, for example, glass-fibre-reinforced epoxy (e.g., FR4). The conductive material 4 is, for its part, usually copper.

The installation base is typically selected in such a way that the thickness of the insulating material layer 1 is greater than the thickness of the components 6 to be later attached to the base, although this is not essential. Recesses 2, the size of which is selected according to the size of the components 6 being installed, are manufactured by a suitable method in the insulating-material layer 1. The recesses 2 are manufactured in such a way that the conductive layer 4 on the surface of the insulating material layer 1 closes one or other end of the recess. This is achieved, for example, by removing the conductive material 4 on the first surface of the installation base around the recess 2. In connection with the removal of the conductive material 4, other patterns can also be formed in the conductive-pattern layer 4, for example, the patterns of the conductors of the circuit that will be formed. After this, the making of recesses 2 is continued using a suitable selective method, which affects the insulating material 1 but not the conductive layer 4. The recess 2 thus manufactured should extend through the entire insulating material layer 1, while the conductive layer 4 at the other end of the recess 2 remains undamaged. Recesses 2 can be made in a corresponding manner from the directions of both surfaces.

Suitable alignment marks are also required to align the components 6, for the creation of which several different methods are available. One possible method is the making of small through-holes in the vicinity of the installation holes 2 of the components 6.

The components 6 are aligned in their installation holes 2 with the aid of the alignment holes or other alignment marks and the components are attached to the conductive layer 4. The components 6 can be attached to the conductive layer 4 using a method that permits the formation of an electrical contact between the conductive layer 4 and the contact areas of the component. Such methods are, for example, the ultrasonic bonding method, the thermo-compression method, and gluing with an electrically conductive adhesive. Alternatively, it is possible to use a method, in which an electrical contact is formed between the conductive layer 4 and the contact areas of the component. Such a method, is, for example, gluing with an insulating adhesive. In the following, the procedure of the process is described in greater detail, in connection with the attachment methods referred to above.

The term ultrasonic methods refers to a method, in which two pieces containing metal are pressed together and vibration energy is brought to the attachment area at an ultrasound frequency. The ultrasound and the pressure created between the surfaces being attached cause the pieces being attached to bond metallurgically to each other. Methods and devices for creating ultrasound joints (ultrasonic bonding) are commercially available. Ultrasonic bonding has the advantage that a high temperature is not required to form the joint.

The term thermo-compression method refers to a method, in which two pieces containing metal are pressed against each other and thermal energy is applied to the joint area. The thermal energy and the pressure created between the surfaces being attached cause the pieces being attached to bond metallurgically to each other. Methods and devices for making thermo-compressed joints (thermo-compression bonding) are also commercially available.

The term adhesive refers to a material, by means of which the components can be attached to the conductive layer. One property of the adhesive is that the adhesive can be spread on the surface of the conductive layer, and/or of the component in a relatively fluid form, or otherwise in a form that will conform to the shape of the surface. Another property of the adhesive is that, after spreading, the adhesive hardens, or can be hardened, at least partly, so that the adhesive will be able to hold the component in place (relative to the conductive layer), at least until the component is secured to the structure in some other manner. A third property of the adhesive is its adhesive ability, i.e. its ability to stick to the surface being glued.

The term gluing refers to the attachment of the component and conductive layer to each other with the aid of an adhesive. Thus, in gluing, an adhesive is brought between the component and the conductive layer and the component is placed in a suitable position relative to the conductive layer, in which the adhesive is in contact with the component and the conductive layer and at least partly fills the space between the component and the conductive layer. After this, the adhesive is allowed (at least partly) to harden, or the adhesive is actively hardened (at least partly), so that the component sticks to the conductive layer with the aid of the adhesive. In some embodiments, the contact protrusions of the component may, during gluing, extend through the adhesive layer to make contact with the conductive layer.

The components 6 can thus be attached to the surface of the conductive layer 4 with the aid of an electrically conductive adhesive. Electrically conductive adhesives suitable for this purpose are generally available in two basic types: isotropically conductive adhesives and anisotropically conductive adhesives. An isotropically conductive adhesive conducts in all directions, whereas an anisotropically conductive adhesive has a conductive direction and a direction diametrically opposite to this, in which the conductivity of the adhesive is extremely low. An anisotropically conductive adhesive can be formed, for example, from an isolating adhesive, into which suitable conductor particles are mixed. If an anisotropically conductive glue is used, the glue can be dosed over the component's entire surface that is being glued. When using an isotropically conductive glue, dosing should be performed by area, so that short-circuits are not created between the contact areas.

After the attachment of the components, the space remaining in the installation recess 2 is typically filled with a filler 8. After this, the conductive layer 4 can be patterned, so that conductive patterns 14 are formed, at least some of which are connected to the contact areas of some of the components 6. After this, the process can be continued by manufacturing additional conductive-pattern layers and manufacturing the necessary through-holes.

Manufacturing exploiting the ultrasonic method and the thermo-compression method are disclosed in greater detail in the same applicant's Finnish patent application FI20030292, filed on 26 Feb. 2003, which is still confidential at the time of filing of the present application.

Manufacturing exploiting conductive glues are, in turn, disclosed in greater detail in the same applicant's Finnish patent application FI20031201, filed on 26 Aug. 2003, which is still confidential at the time of filing of the present application.

Thus, instead of attachment methods forming an electrical contact, it is also possible to use methods, in which an electrical contact is not formed. Such a joint can be made, for example, by gluing the component 6 to the surface of the conductive layer 4 with the aid of an insulating adhesive. After gluing, the installation recess 2 can be filled with a filler 8 and the feed-throughs made, through which electrical contacts can be formed between the contact areas of the components 6 and the conductive layer 4. Holes 17 for the feed-throughs are made in the conductive layer 4, at the contact areas of the components 6. The holes 17 are made in such a way that they also break through the adhesive layer that has remained on top of the contact areas, or the contact protrusions. The holes 17 thus extend as far as the material of the contact protrusions or other contact areas of the components 6. The holes 17 can be made, for example, by drilling with a laser device, or by using some other suitable method. After this, conductive material is brought to the holes 17, in such a way that an electrical contact is formed between the component 6 and the conductive layer 4.

After this, the conductive layer 4 can be patterned, so that conductive patterns 14 are formed, at least some of which are connected to some of the contact areas of the components 6. After this, the process can be continued by manufacturing additional conductive-pattern layers and manufacturing the necessary feed-throughs. Manufacturing processes exploiting an insulating adhesive are disclosed in greater detail in the same applicant's Finnish patent application FI20030493, filed on 1 Apr. 2003, which is still confidential at the time of filing of the present application.

The manufacturing processes according to the examples can be implemented using manufacturing methods that are generally known to one versed in the art of manufacturing circuit boards.

In the following, the stages of the method shown in FIGS. 1-17 are examined in greater detail.

Stage A (FIG. 1):

In stage A, a sheet of suitable insulating material 1, from which the body of the installation base is formed, is selected for the electronic-module manufacturing process. In the embodiment using single insulating-material layer, the insulating-material layer 1 should preferably be thicker that the component being installed. It will then be possible to embed the component entirely inside the installation base and the electronic module will be smooth on both sides. Thicker special components, the rear surface of which will protrude beyond the insulating-material layer 1, can, of course, also be embedded in the installation base. This is the preferred procedure particularly in such embodiments, in which several insulating-material layers are used, which are joined together during the process. In that case, the components can be embedded entirely in the structure, if the total thickness of the insulating-material layer exceeds the thickness of the component. On account of the durability of the structure, it is preferable for the components in the finished electronic module to be located entirely inside the installation base.

The insulating-material layer 1 can be, for example, a polymer base, such as a sheet of glass-fibre reinforced epoxy FR4. Other materials suitable for the insulating-material layer 1 are PI (polyimide), FR5, aramid, polytetrafluoroethylene, Teflon®, LCP (liquid crystal polymer), and a pre-hardened binder layer, i.e. prepreg.

Prepeg refers to one of the basic materials of the circuit-board industry, which is generally a glass-fibre-reinforced insulating mat saturated with B-stage resin. A pre-hardened binder layer is typically used as a binding insulating material, when manufacturing multi-layer circuit-boards. Its B-stage resin is cross-bridged in a controlled manner with the aid of temperature and pressure, for example, by pressing or laminating, so that the resin hardens and becomes C-stage. In the controlled hardening cycle, during the rise in temperature, the resin softens and its viscosity diminishes. Forced by the pressure, the fluid resin fills the holes and openings in its boundary surface. When using a pre-hardened binder layer, this property is exploited to fill the empty space remaining around the components. In this way, it is possible to further simplify the electronic-module manufacturing methods described in the examples, as the installation recesses for the components need not be filled with a separate filler.

The insulating-material layer 1 is surfaced on both sides 1a, 1b, with a conductive layer 4, for example, a metal layer. The manufacturer of the electronic module can also select a ready surfaced insulating sheet as the basic material.

Stage B (FIG. 2):

In stage B, conductive patterns 14 are formed from the conductive layer 4, using some suitable method. The removal of the conductive material can be performed, for example, using vaporization with a laser, or some selective etching method, which are widely used and well known in the circuit-board industry. The conductive pattern 14 is made in such a way that the surface of the insulating-material layer 1 is exposed at the installation recesses 2 made for the components 6, or the side of the surface 1a or 1b. Correspondingly, the conductive material layer 14 on the opposite surface 1a or 1b of the insulating-material layer 1 is left intact.

Stage C (FIG. 3):

In stage C, suitably sized and shaped recesses 2 are made in the insulating-material layer 1, for the embedding of the components. The recesses 2 can be made as required, using, for example, some known method used in circuit-board manufacture. The recesses 2 can be made, for example, using $CO_2$. The recesses 2 are made from the direction of the second surfaces 1b and extend through the entire insulating-material layer 1, as far as the surface 1a of the conductive material layer 14 on the opposite surface of the layer.

Stage D (FIG. 4):

In stage D, the blank of the electronic module is turned the other way round.

Stage E (FIG. 5):

In stage E, additional installation recesses 2 in the insulating-material layer 1 are made for components in the direction of the first surface 1a. Otherwise, the recesses 2 can be made in the same way as in stage C.

Stage F (FIG. 6):

In stage F, an adhesive layer 5 is spread on the bottom of the installation recesses 2, on top of the conductive layer 14. The thickness of the adhesive layer 5 is selected so that the adhesive suitably fills the space between the component 6 and the conductive layer 14, when the component 6 is later pressed onto the adhesive layer 5. If the component 6 includes contact protrusions 7, it would be good for the thickness of the adhesive layer 5 to be greater, for example about 1.5-10 times, the height of the contact protrusions, so that the space between the component 6 and the conductive layer 4 will be well filled. The surface area of the adhesive layer 5 formed for the component 6 can also be slightly larger than the corresponding surface area of the component 6, which will also help to avoid the risk of inadequate filling.

Stage F can be modified in such a way that the adhesive layer 5 is spread on the attachment surfaces of the components 6, instead of on the attachment areas of the conductive layer 14. This can be carried out, for example, by dipping the component in adhesive, prior to setting it in place in electronic module. It is also possible to proceed by spreading the adhesive on both the attachment areas of the conductive layer 14 and on the attachment surfaces of the components 6.

The adhesive used in this example is thus an electrical insulator, so that the adhesive layer 5 itself does not form electrical contacts between the contact areas of the component 6.

Stage G (FIG. 7):

In stage G, the components 6 to be installed from the direction of the first surface 1a are set in place in the electronic module. This can be done, for example, by pressing the components 6 into the adhesive layer 5, with the aid of an assembly machine.

Stage H (FIG. 8):

In stage H, the blank of the electronic module is turned the other way round (see stage D).

Stage I (FIG. 8):

In stage I, an adhesive layer 5 is spread on the bottom of the installation recesses 2 opening onto the second surface 1b. Stage I is performed correspondingly to stage F, but from the direction of the opposite surface of the electronic module.

The work stages (e.g., stage F and I) made from opposite sides of the electronic module can, in principle, also be performed simultaneously or consecutively without turning the blank, if the manufacturing equipment being used permits the work stages to be made from two directions.

Stage J (FIG. 9):

In stage J, the components 6 to be installed from the direction of the second surface 1b are set in place, correspondingly to stage G of the electronic module.

Stage K (FIG. 10):

In stage K, the space remaining between the components 6 and the installation base is filled entirely with a filler 8, which is, for example, some suitable polymer. If the insulating material 1 is a pre-hardened binder layer (prepreg), this stage can be omitted.

Stage L (FIG. 11):

In stage L, holes 17 are manufactured for the electrical contacts of the components 6. The holes 17 are made through the conductive layer 14 and the adhesive layer 5, in such a way that the material of the contact protrusions, or the corresponding contact areas of the components 6 is exposed. The holes 17 can be made, for example, by drilling with the aid of a laser. A sufficient number of holes 17 is made at the contact areas of the components 6. If, in the process, it is intended to form direct contacts to the components 6 not only through the conductive layer 14, but also through some other conductive layer, the holes 17 need not necessarily be made at contact area participating in such a contact. Typically, in order to form a reliable contact between the contact areas of a component 6 and, for example, a conductive layer 24, a hole 28 is made in two parts; first a hole 17 is made between the component 6 and the conductive layer 14 and then a hole 27 is made directly on top of this.

Stage M (FIG. 12):

In stage M, holes 11 are made in the module for the feed-throughs. The holes 11 can be made, for example, mechanically by drilling.

Stage N (FIG. 13):

In stage N, conductive material 15 is grown into the holes 17 made in stage L and into the through-holes 11 made in stage M. In the example process, the conductive material 15 is also grown elsewhere on top of the base, so that the thickness of the conductive layers 14 also increases.

The conductive material 15 being grown can be, for example, copper, or some other sufficiently electrically conductive material. In the selection of the conductive material 15, attention must be paid to the ability of the material to form an electrical contact with the material of the contact protrusions 7 or other contact areas of the component 6. In one example process, the conductive material 15 is mainly copper. Copper metallization can be made by surfacing the holes 11 and 17 with a thin layer of chemical copper and after this the surfacing can be continued using an electrochemical copper-growing method. Chemical copper is used, for example, because it will also form a surface on top of adhesive and will act as an electrical conductor in electrochemical surfacing. The growth of the metal can thus be performed using a wet-chemical method, so that the growth is cheap.

Stage N is intended to form an electrical contact between the components 6 and the conductive layer 14. In stage N, it is not essential to increase the thickness of the conductive layer 14, instead the process can be equally well designed in such a way that, in stage I, the holes 17 and 11 are only filled with a suitable material. The conductive layer 15 can be manufactured, for example, by filling the holes 17 and 11 with an electrically conductive paste, or by using some other metallization method suitable for micro-feed-throughs.

In the later figures, the conductive layer 15 is shown merged with the conductive layer 14.

Stage O (FIG. 14):

In stage O, the conductive layers 14 are patterned in such a way that conductive patterns 14 are formed on both surfaces of the sheet 1. The patterning can be performed, for example, in the manner described in stage B.

After stage O, the electronic module contains a component 6 or several components 6, as well as conductive patterns 14, with the aid of which the component or components 6 can be connected to an external circuit or to each other. The preconditions then exist for manufacturing an operational totality. The process can thus be designed in such a way that the electronic module is ready after stage O and FIG. 14 indeed shows one possible electronic module. If desired, the process can also be continued after stage O, for example, by covering the electronic module with a protective substance, or by manufacturing additional conductive-pattern layers on the first and/or second surface.

Stage P (FIG. 15):

In stage P, an insulating-material layer 21 is made on both surfaces of the sheet 1 as well as a conductive layer 24 on top of the insulating-material layer 21. Stage P can be performed, for example, by pressing suitable RCF foils onto both surfaces of the sheet 1. The RCF foil then includes both an insulating-material layer 21 and a conductive layer 24. When the RCF foils are pressed onto the sheet 1 with the aid of heat and pressure, the polymer of the layer 21 forms a unified and tight insulating-material layer between the conductive layer 14 and 24. By means of this procedure, the conductive layer 24 too becomes quite flat and smooth.

Stage Q (FIG. 16):

In stage Q, holes 27 are made for forming feed-throughs between the conductive layer 14 and 24. The holes can be made, for example, as in stage L using a laser. In some embodiments, it is also possible to make holes 28, with the aid of which a straight feed-through can be formed with the conductive layer 24 and the contact protrusion or contact area of the component 6.

Stage R (FIG. 17):

In stage R, conductive material 15 is grown in the holes 27 (and the holes 28) while at the same time the thickness of the conductive layer 24 can also be increased. Stage R can be performed correspondingly to Stage N.

After stage R, the process can be continued by patterning the conductive layers 24 and possibly by manufacturing additional conductive layers on either or both of the surfaces. Separate components can also be connected to the conductive layer on the surface of the electronic module, in the conventional manner of circuit-board technology.

The following will deal, with the aid of FIGS. 18-27, with some possible modifications of the manufacturing process.

Stage A2 (FIG. 18):

In stage A2, as in stage A, a suitable insulating-material sheet 1, from which the body of the installation base is formed, is selected for the manufacturing process of the electronic module. In the example process, the insulating-material layer 1 is surfaced from the first surface 1a with a conductive layer 4, for example, a metal layer.

Stage B2 (FIG. 19):

In stage B2, as in stage C, suitably sized and shaped recesses 2 are manufactured in the insulating-material layer 1, for the components to be embedded in the sheet. The recesses 2 are made from the direction of the second surface 1b and extend through the entire insulating-material layer 1 as far as the surface of the conductive-material layer 4 on the opposite surface of the layer.

Stage C2 (FIG. 20):

In stage C2, the components 6 to be installed from the direction of the second surface 1b are set in place in the recesses 2 and connected to the conductive layer 4. Electrical contacts are then also formed between the contact protrusions or contact areas of the components and the conductive layer 4. The connection of the components 6 can be made, for example, by gluing with an isotropically or anisotropically electrically conductive adhesive. The attachment can also be performed using some other applicable method, for example, the ultrasonic or thermo-compression method.

Stage D2 (FIG. 20):

In stage D2, the space remaining between the component 6 and the installation base is entirely filled with a filler 8, which is, for example, some suitable polymer.

Stage E2, (FIG. 21):

In stage E2, conductive patterns 14 are formed from the conductive layer 4, using some suitable method. The removal of the conductive material can be performed, for example, by vaporization with a laser, or using one of the selective etching methods, which are widely using and well known in the circuit-board industry.

Stage F2 (FIG. 22):

In stage F2, a conductive layer 9 is formed on the second surface 1b of the sheet 1. Stage F2 can be performed, for example, by laminating an RCF-foil onto the second surface 1b.

Stage G2 (FIG. 23):

In stage G2, recesses 2 for components are made in the insulating-material layer 1, as in stage B2. Now the recesses 2 are manufactured from the direction of the first surface 1a and extend as far as the surface of the conductive-material layer 9.

Stage H2 (FIG. 24):

In stage H2, the components 6 to be installed from the direction of the first surface 1a are connected to the conductive layer 9. The stage can be performed as in stage C2.

Stage I2 (FIG. 20):

In stage I2, the space remaining between the components 6 and the installation base is entirely filled with a filler 8, which is, for example, some suitable polymer.

Stage J2 (FIG. 25):

In stage J2, conductive patterns 19 are formed from the conductive layer 9, using a suitable method.

Stage K2 (FIG. 26):

In stage K2, holes 27 are made to form feed-throughs between the conductive-pattern layers 14 and 19.

Stage L2 (FIG. 27):

In stage L2, conductive material is grown in the holes 27. Stage L2 can be performed correspondingly as stage N.

After stage L2, the electronic module includes two conductive-pattern layers and embedded components 6 connected to them. If several conductive layers are not required in the electronic module being manufactured, the module can, for example, be protected with a protective substance after stage L2. After stage L2, it is also possible, if wished, to manufacture additional conductive layers in the module, or to connect surface-assembled components to it. The modules can also be connected to each other to create a multi-layer structure.

The above descriptions are of embodiments, in which the insulating-material layer 1 is formed from a single unified insulating-material sheet, for example, a glass-fibre-reinforced epoxy sheet, or a prepreg sheet. However, the insulating-material layer 1 can equally well be manufactured from more than one part. It is then also possible to proceed in such a way that the insulating-material layer 1 is formed of more than one insulating material. FIGS. 28-31 shows two such embodiments.

Figure 28:
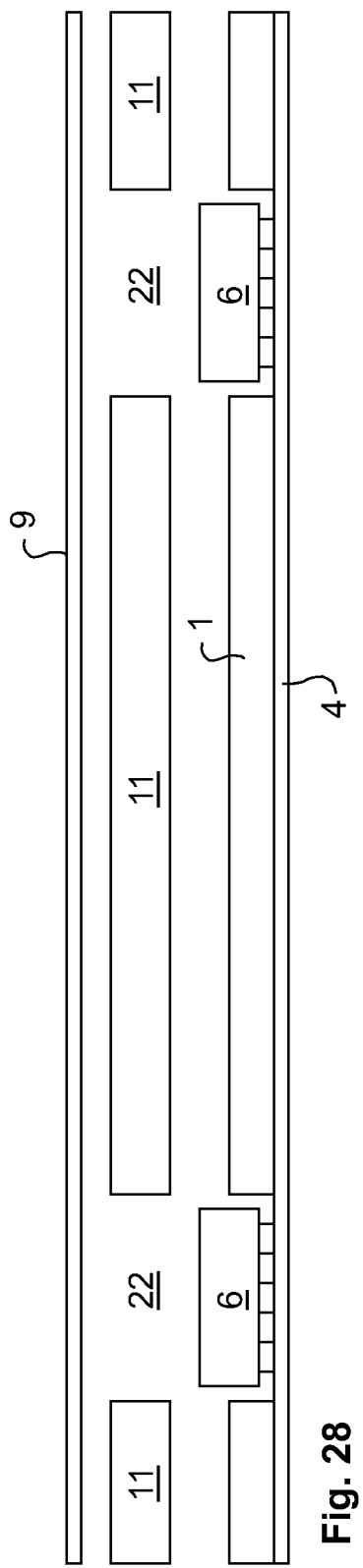
FIGS. 28 and 29 show two intermediate stages of the manufacture of an electronic module in manufacturing methods according to third embodiments.

FIG. 28 shows an element, which includes a first insulating-material layer 1, with components 6 set in recesses made in it. In addition, the element includes a conductive layer 4 on the surface of the insulating-material layer 1. The thickness of the first insulating-material layer 1 is preferably greater than the height of the components 6. An element like that shown in the figure can be manufactured, for example, by combining the sub-processes of the previous series of figures. In addition to the element, the figures also show a second insulating-material layer 11, in which recesses 22 for components 6, as well as a second conductive layer 9 are also made.

In the above embodiment, the second insulating-material layer 11 is prepreg. The first insulating-material layer 1 can then also be of some other insulating material, for example, a glass-fibre-reinforced epoxy sheet. After this, the layer are joined together, resulting in the element depicted in FIG. 29. As can be seen from FIG. 28, the resin contained in the prepreg fills the space between the component 6 and its surroundings. After this, the manufacture of the electronic module can be continued with the aid of the sub-processes described above.

Figure 30:
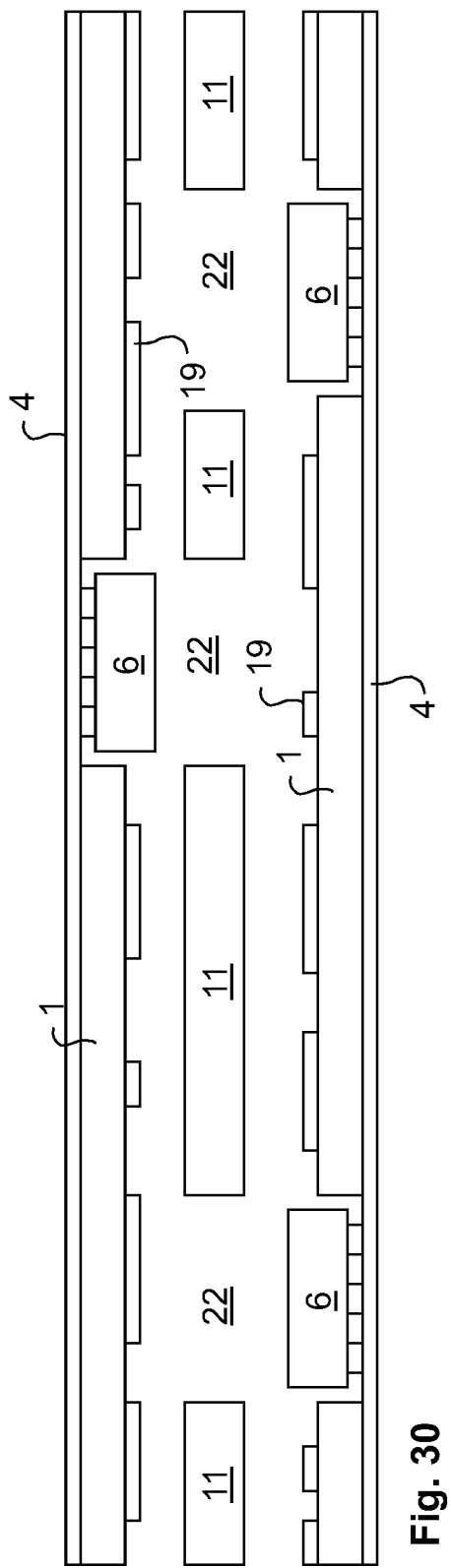
FIGS. 30 and 31 show two intermediate stages of the manufacture of an electronic module in manufacturing methods according to fourth embodiments.

FIG. 30 shows a first and a second element, both of which include a first insulating-material layer 1 and components 6 in recesses manufactured in the insulating-material layer 1. In addition, the elements include conductive layers 4 on the first surfaces of the insulating-material layers 1 and conductive patterns 19 on the second surfaces of the insulating-material layers 1. In both elements, the thickness of the first insulating-material layer is less than the height of the components 6. In an alternative embodiment, not shown, the thickness of the insulating-material layers is greater than the height of the components 6. Referring again to FIG. 30, the second element is rotated relative to the first element in such a way that the conductive patterns 19 face each other and a second insulating-material layer 11, in which recesses 22 are also made for components 6, is placed between the elements. After this, the elements and the second insulating-material layer 11 are attached to each other. As described above, the second insulating-material layer 11 spreads to fill voids around components 6, resulting in the module structure shown in FIG. 31. The structure of FIG. 31 is compact and thin, and, at this stage of the process, it already includes four conductive layers (layers 4, 4, 19, and 19).

Figure 29:
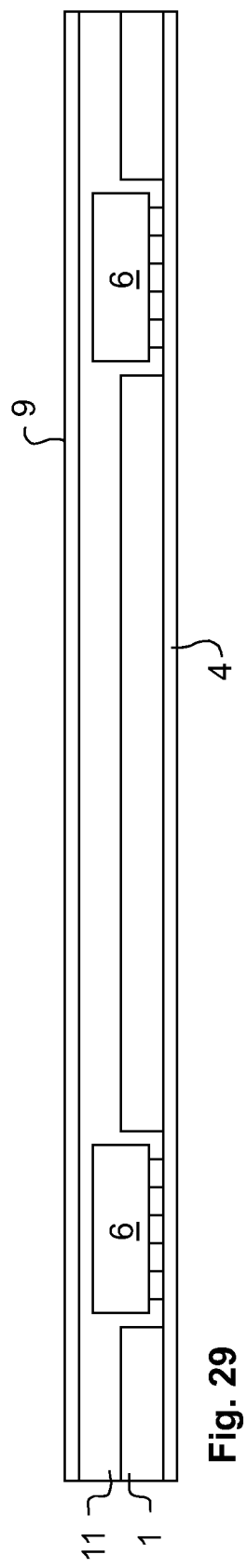
Figure 31:
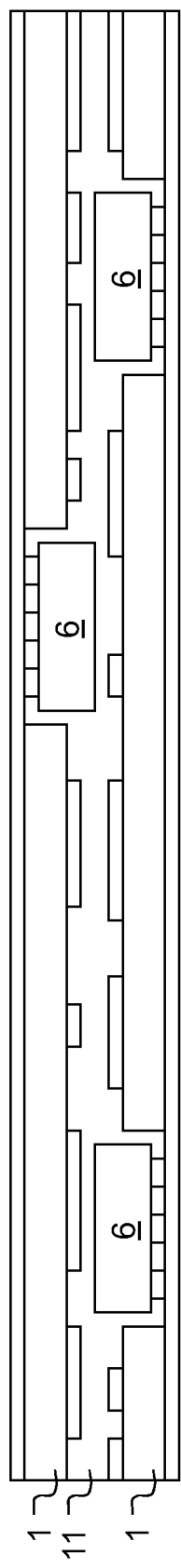

In the embodiment shown in FIGS. 30 and 31 too, prepreg can be used as the second insulating-material layer 11. The first insulating-material layer 1 of both elements can then also be some other insulating material, for example, a glass-fibre-reinforced epoxy sheet. With the aid of the prepreg, excellent filling is achieved in the space between the elements, as shown in the example of FIG. 29. The modules shown in FIGS. 30 and 31 can be made, for example, with the aid of the sub-processes described above. The manufacture of the electronic module can also be continued in a corresponding manner as, for example, that of the elements shown in FIG. 10 or FIG. 24, making allowance for the selected connection techniques, the patterning requirement of the conductive layers 4, and other similar special requirements of the process.

The examples of the previous figure series shown some possible processes, with the aid of which our invention can be exploited. Our invention is not, however, restricted to only the processes disclosed above, but instead the invention also covers other different processes and their end products, taking into account the full scope and equivalence interpretation of the Claims. The invention is also not restricted to the constructions and methods described in the examples, it being obvious to one versed in the art that various applications of our invention can be used to manufacture very many different electronic modules and circuit boards, which differ from the examples described above to even a great extent. The components and connections of the figures are thus presented only to illustrate the manufacturing process. Thus, a great many alterations can be made to the process of the examples given above, without, however, deviating from the basic idea according to the invention. The alterations can relate, for example, to the manufacturing techniques described in the different stages, or to the mutual sequence of the process stages.

In the processes described above, it is possible, for example, to use several techniques for attaching the components, for example, in such a way that the components to be attached from the direction of the first surface are attached using some first technique and the components to be attached from the direction of the second surface are attached using some second technique, which differs from the said first technique.

In the examples given above, electronic modules are manufactured, which include components embedded from a first and a second direction. Of course, within the scope of the invention, it is also possible to manufacture such simpler modules, which include only components embedded from one direction. With the aid of such simpler modules, it is also possible a module including components embedded in two directions. The module can be manufactured, for example, in such a way that two modules are laminated together from their 'back' sides, so that the active surfaces contained in the sub-modules face the opposite outward surface of the module that has been laminated together.

What is claimed is:

1. An electronic module comprising:
 a first element comprising
  a first insulating-material layer having a first surface and a second surface, and a first thickness between the first surface and the second surface;
 a first recess in the first insulating-material layer;
 a first component in the first recess, the first component having a first height greater than the first thickness;

a first conductive pattern layer on the first surface and electrically connected to the first component; and a second conductive pattern layer on the second surface, the first component extending through the second conductive pattern layer;

a second element coupled to the first element, the second element comprising a second insulating-material layer having a third surface and a fourth surface, and a second thickness between the third surface and the fourth surface;

a second recess in the second insulating-material layer;

a second component in the second recess, the second component having a second height greater than the second thickness;

a third conductive pattern layer on the third surface and electrically connected to the second component; and a fourth conductive pattern layer on the fourth surface;

a third insulating-material layer between the second conductive pattern layer and the fourth conductive pattern layer, wherein the third insulating-material layer fills space between the first element and the second element, and wherein an upper surface of the first component is higher than an upper surface of the second conductive pattern layer.

2. The electronic module of claim 1, further comprising insulating material in the first recess and the second recess.

3. The electronic module of claim 2, wherein the insulating material fills space in the first recess and in the second recess around the first component and the second component.

4. The electronic module of claim 1, wherein the first element further comprises multiple components.

5. The electronic module of claim 1, wherein the electronic module further comprises a plurality of additional components disposed in at least one of the first element and the second element.

6. The electronic module of claim 5, wherein at least one of the plurality of additional components is different from another of the plurality of additional components.

7. The electronic module of claim 1, wherein the first component is an active component having an active surface facing the first conductive pattern layer.

8. The electronic module of claim 7, wherein the second component is an active component having an active surface facing the third conductive pattern layer, whereby the active surfaces of the first component and the second component face opposite directions.

9. The electronic module of claim 1, further comprising a first layer of electrically insulating adhesive mechanically attaching the first component to the first conductive pattern layer.

10. The electronic module of claim 1, further comprising a second layer of electrically insulating adhesive mechanically attaching the second component to the third conductive pattern layer.

11. The electronic module of claim 1, wherein the first insulating material layer is of a first insulating material, the second insulating-material layer is of a second insulating material, and the third insulating-material layer is of a third insulating material different from the first insulating material and the second insulating material.

12. The electronic module of claim 1, wherein the first insulating material layer and the second insulating-material layer both comprise epoxy with glass-fibre reinforcement, and the third insulating-material layer comprises at least epoxy.

13. The electronic module of claim 1, wherein the first component has first contact areas facing the first conductive pattern layer and the electronic module comprises first contact elements metallurgically and electrically connecting at least some of the first contact areas to the first conductive pattern layer.

14. The electronic module of claim 1, wherein the second component has second contact areas facing the third conductive pattern layer and the electronic module comprises second contact elements metallurgically and electrically connecting at least some of the second contact areas to the third conductive pattern layer.

* * * * *